(12) United States Patent
Fukuyama et al.

(10) Patent No.: US 6,730,929 B2
(45) Date of Patent: May 4, 2004

(54) ORGANIC ELECTROLUMINESCENT DEVICE

(75) Inventors: Masao Fukuyama, Tokyo (JP); Mutsumi Suzuki, Yokohama (JP); Yuji Kudo, Omiya (JP); Yoshikazu Hori, Kobe (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 150 days.

(21) Appl. No.: 09/740,858

(22) Filed: Dec. 21, 2000

(65) Prior Publication Data

US 2001/0005021 A1 Jun. 28, 2001

(30) Foreign Application Priority Data

| Dec. 24, 1999 | (JP) | ................................. 11-367200 |
| Mar. 16, 2000 | (JP) | ................................. 2000-073836 |
| Jun. 29, 2000 | (JP) | ................................. 2000-196111 |
| Nov. 9, 2000 | (JP) | ................................. 2000-341560 |

(51) Int. Cl.⁷ ................................................. H01L 35/24
(52) U.S. Cl. ...................... 257/40; 257/103; 313/504
(58) Field of Search ........................ 257/87, 103, 79, 257/82, 431, 40, E51.018, E51.026, E27.119, E33.064; 313/504, 506, 507, 509

(56) References Cited

U.S. PATENT DOCUMENTS 6,069,442 A * 5/2000 Hung et al. ............... 313/504
6,208,075 B1 * 3/2001 Hung et al. ............... 313/504

FOREIGN PATENT DOCUMENTS

| JP | 10-219242 | 8/1998 |
| JP | 2826381 | 9/1998 |
| WO | 91/03142 | 3/1991 |

OTHER PUBLICATIONS

"Organic Electroluminescent Diodes," by Tang et al., Appl. Phys. Lett., vol. 51, No. 12 (Sep. 21, 1987), pp. 913–915.

"Electroluminescence of Doped Organic Thin Films," by Tang et al., J. Appl. Phys., vol. 65, No. 9 (May 1, 1989), pp. 3610–3616.

* cited by examiner

*Primary Examiner*—Wael Fahmy
*Assistant Examiner*—Ginette Peralta
(74) *Attorney, Agent, or Firm*—McDermott, Will & Emery

(57) ABSTRACT

An organic electroluminescent device comprises a pair of electrodes and a layer structure provided between the paired electrodes and including, at least, an emission layer comprising a specific type of oligomer. The layer structure may further comprise an electron injection layer and an electron transport layer, one of which comprises a specific type of oligomer. Alternatively, the layer structure may be of the type which comprises an organic layer having a charge transport interference layer in the inside thereof along with an emission layer.

6 Claims, 2 Drawing Sheets

ORGANIC ELECTROLUMINESCENT DEVICE

BACKGROUND OF THE INVENTION

1. Field of the Invention

This invention relates to a light emission device, which is utilizable in various fields as a variety of display devices, and more particularly, to an organic electroluminescent device that works at a low drive voltage, is high in luminance and is excellent in stability.

2. Description of the Related Art

Electroluminescent devices are self-luminescent in nature, and thus, are brighter than liquid crystal devices, enabling a clear display. Accordingly, research workers have long studied such devices. Existing electroluminescent devices, which arrive at a level of practical use, are those which make use of inorganic materials such as ZnS. However, such inorganic electroluminescent devices have not been in wide use because their drive voltage for emission is as high as 200 V or over.

In contrast thereto, organic electroluminescent devices, which utilize light-emitting organic materials, were far from the practical level yet. In 1987, C. W. Tang et al of Eastman Kodak Co., (Applied Physics/Letters, Vol. 51, p. 918, 1987) developed a builtup structure device, with a drastic advance in characteristic performance. More particularly, they succeeded in light emission by use of a builtup structure which includes a phosphor or fluorescent body having the stable structure of a deposition film and capable of transporting electrons, and an organic film capable of transporting holes. The carriers from both are injected into the phosphor body. This organic electroluminescent device has a much improved luminous efficiency, and is capable of emission at 1000 cd/m$^2$ or more by application of a voltage of 10V or below.

Furthermore, as set out in Journal of Applied Physics, Vol. 65, p. 3610, 1989), C. W. Tang et al of Eastman Kodak Co., proposed an emission layer using a guest/host system, making it possible to further improve a luminous efficiency and use a diversity of luminescent materials.

Since then, many researchers have extensively made studies and developments, so that light emitting materials and charge transport materials used for the organic electroluminescent devices have been developed, along with improvements in device structure. As a consequence, there has been reported a device that is low in luminance and has a half-life time of luminance of approximately 10,000 hours.

However, for the use of an organic electroluminescent device as an electronic device, its drive life is not satisfactory, thus leaving a problem, from the standpoint of the practical use thereof, on how to drastically improve the life.

Further, in such an organic electroluminescent device as set out hereinabove, the characteristics of the device depend greatly on the types of organic layers including an electron transport layer, an emission layer and a hole transport layer and also the type of electrode metal. Especially, the organic layers have important performances of injection, transport and recombination of charges and also of light emission. In order to realize a device with excellent characteristics, it is important to appropriately select materials suited for the functions of the respective layers. In addition, for obtaining a highly durable device, it is also important to use, as the organic layers, materials, each capable of forming a stable film without causing aggregation.

Needless to say, the charge injection and transport layer is broadly classified into a hole injection and transport layer and an electron injection and transport layer. These layers, respectively, serve to readily inject charges from an electrode and transport the injected charges to an emission region. The charge injection layer and the charge transport layer may be made of one material, or may be made of different materials, respectively. For a hole injection layer material, there is usually used a material whose HOMO (highest occupied molecular orbital) level is small in order to permit easy injection of holes from an anode. Mention is particularly made, as the injection layer material, of copper phthalocyanine (CuPc), tris{4-[(3-methylphenyl)phenylamino]phenyl}amine (M-MTDATA and the like. For a hole transport material, triphenylamine derivatives are ordinarily used. In Japanese Patent Publication No. 2826381, it is stated that conductive oligomers, particularly, thiophene oligomers, are preferred for use as a material for forming an organic semiconductive region as a hole injection layer or a hole injection and transport layer. On the other hand, quinolinol metal complexes, typical of which are oxadiazole derivatives and tris(8-hydroxyquinolinol) aluminium (Alq), have been studied for use as an electron transport material.

However, although these materials exhibit good capability of injection and transport of charges, most of them are not stable when converted to a thin film.

Many studies have been made on an emission layer wherein a number of compounds have been proposed and developed for use as the emission layer. For instance, a small amount of a fluorescent dye is dispersed in a film-forming material to provide a film for use as an emission layer so as to realize a high device efficiency, an elongated life and a proper control of an emission color. This technique is very effective against a fluorescent dye that is likely to undergo concentration quenching. However, such an emission layer is not sufficient to meet characteristic requirements with respect to the emission efficiency and drive durability.

SUMMARY OF THE INVENTION

It is accordingly an object of the invention to provide an organic electroluminescent device, which overcomes the problems involved in the prior art.

It is another object of the invention to provide an improved organic electroluminescent device, which has a high luminous efficiency and excellent drive durability.

It is a further object of the invention to provide an improved organic electroluminescent device, which is significantly improved in working or drive life.

The above objects can be achieved, according to one embodiment of the invention, by an organic electroluminescent device, which comprises a pair of electrodes, and a layer structure provided between the paired electrodes and including, at least, an emission layer comprising up to 10 mole % of a thiophene oligomer of the following formula

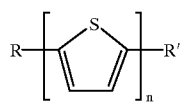

wherein R and R' independently represent H, an alkyl group having from 1 to 10 carbon atoms, preferably from 1 to 4 carbon atoms, an amino group, an aryl group and n is an integer of 2 to 10.

The electroluminescent unit may consist of the emission layer alone. Preferably, the layer structure includes a hole injection layer, a hole transport layer and the emission layer formed, on one of the electrodes serving as an anode, in this order.

According to another embodiment of the invention, there is also provided an organic electroluminescent device, which comprises a pair of electrodes, and a layer structure provided between the paired electrodes and including an emission layer, a hole injection layer and a hole transport layer wherein at least one of the hole injection layer and the hole transport layer comprises an oligomer selected from the group consisting of a triphenylamine oligomer of the following formula, a thiophene oligomer as defined above and mixtures thereof

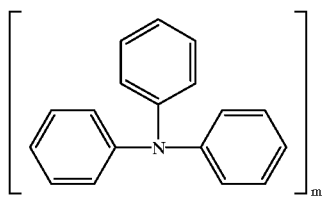

wherein m is an integer of 2 to 6. The triphenylamine oligomer may be substituted or unsubstituted.

According to a further embodiment of the invention, there is provided an organic electroluminescent device, which comprises a pair of electrodes and a layer structure provided between the paired electrodes and including an emission layer and at least one organic layer capable of transporting electrons or holes and in contact with the emission layer wherein the organic layer comprises a fluorescent material having an absorption peak wavelength shorter than a peak wavelength of luminescence emitted from the emission layer.

Further, the at least one organic layer may include two organic sub-layers. In this case, the fluorescent material is present in one of the sub-layers not in contact with the emission layer.

According to a still further embodiment of the invention, there is provided an organic electroluminescent device, which comprises a pair of electrodes, and a layer structure sandwiched between the paired electrodes and including an organic layer capable of transporting electrons or holes and an emission layer wherein the organic layer has a charge transport interference sub-layer therein when the organic layer consists of a hole transport layer made of a hole transport material so that the sub-layer is made of an organic material having an ionization potential greater than the hole transport material of the organic layer, or wherein the organic layer has a charge transport interference sub-layer therein when the organic layer consists of an electron transport layer made of an electron transport material so that the sub-layer is made of an organic material having an electron affinity smaller than the electron transport material of the organic layer.

According to a yet further embodiment of the invention, there is also provide an organic electroluminescent device comprising a pair of electrodes, and a layer structure sandwiched between the paired electrodes and including a charge transport layer and an emission layer wherein the charge transport layer has a charge transport interference sub-layer therein, and the sub-layer is made of a mixture of both a hole transport material and an electron transport material, an inorganic compound or a metal.

PREFERRED EMBODIMENTS OF THE INVENTION

Figure 1:
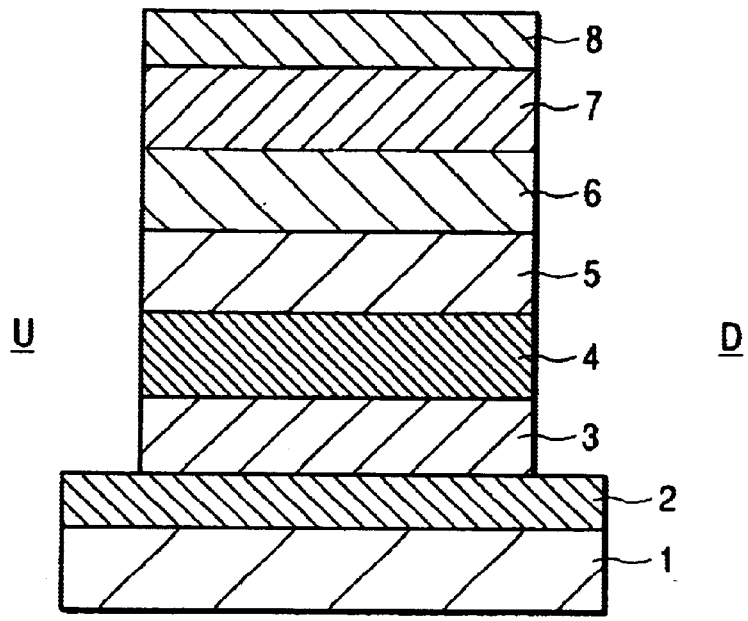
FIG. 1 is a schematic sectional view showing an organic electroluminescent device according to one embodiment of the invention.

According to one embodiment of the invention, there is provided an organic electroluminescent device of the invention, which comprises a pair of electrodes, and a layer structure provided between the pair of electrodes and including, at least, a electroluminescent or emission layer comprising up to 10 mole % of a thiophene oligomer.

The basic layer arrangement of the device according to the invention is in more detail described with reference to the accompanying drawings, particularly, to FIG. 1. It will be noted that in the drawings, like reference numerals indicate like parts or members throughout the specification unless otherwise indicated.

In FIG. 1, there is shown an organic electroluminescent device D including an electroluminescent unit U sandwiched between an anode 2 and a cathode 8 and formed on a substrate 1 made, for example, of glass via the anode 2. The unit U is depicted as having an anode 2, a layer structure including a hole injection layer 3, a hole transport layer 4, an emission layer 5, an electron transport layer 6 and an electron injection layer 7, and a cathode 8 arranged in this order, and this order may be reversed. In the practice of the invention, the unit U should have, at least, the electrodes 2, 8 sandwiching the emission layer 5. In view of the luminous efficiency, it is preferred that the emission layer is provided in contact with a charge transport layer capable of transporting electrons or holes and including the hole transport layer 3 and/or the electron transport layer 6. More preferably, such an arrangement as depicted in FIG. 1 is used as is known in the art.

The hole injection layer 3 and the hole transport layer 4 may be combined into one layer serving as a hole injection and transport layer. Likewise, the electron injection layer 7 and the electron transport layer 8 may be combined as one layer capable of injection and transport of electrons. As a matter of course, if a material capable of injecting and transporting holes and also of light emission is used, the resultant layer may serve as both an emission layer and a hole injection and transport layer. This is true of the case where a material capable of injecting and transporting electrons and also of light emission is used, i.e. the resultant layer may serve as both an emission layer and an electron injection and transport layer.

Fabrication of the device D is now described.

The anode 2 is first formed usually on an optically transparent, insulating substrate made, for example, of glass or an optically transparent plastic material such as polyesters, polyethylene terephthalate, polyester sulfones or the like. Preferably, the anode 2 is made, for example, of a conductive transparent material such as indium tin oxide (ITO). Alternatively, the anode may be made of a conductive semi-transparent film of a metal, such as gold or platinum. A film of such a material or metal as mentioned above is formed on the substrate by vacuum deposition or sputtering, thereby forming an optically transparent or semi-transparent film as the anode 2. This anode is usually formed in a thickness of 0.02 to 1 μm.

Thereafter, the emission layer 5 is formed on the anode 2 by a vacuum co-deposition technique. In this embodiment, the emission layer 5 should be made of a composition comprising an organic material capable of emitting light upon application of a drive voltage by means of the pair of electrodes 2, 8 and up to 10 mole % of a thiophene oligomer of the following formula

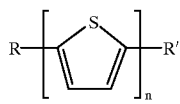

wherein R and R' independently represent H, an alkyl group having from 1 to 10 carbon atoms, an amino group or an aryl group, and n is an integer of 2 to 10.

Example of the alkyl group include, methyl, ethyl, propyl, butyl, pentyl, hexyl, heptyl, octyl, nonyl, decyl and the like. The amino group may include $NH_2$, diphenylamino, dimethylamino, diethylamino or the like. The aryl group may be substituted or unsubstituted and include phenyl, naphthyl, pyrenyl and the like. n is preferably in the range of 2 to 7.

The content of the oligomer is generally in the range of up to 10 mole %, preferably from 0.1 to 5 mole %, based on the composition. The organic material contained in the composition includes, for example, metal complexes, styryl derivatives, coumarin derivatives, merocyanine derivatives, oxazole derivatives, thiazole derivatives, styryl derivatives, flavone derivatives, quinoline derivatives, condensed polycyclic compounds and the like. Specific examples include tris(8-quinolinol)aluminium (Alq), DPVBi of the following formula

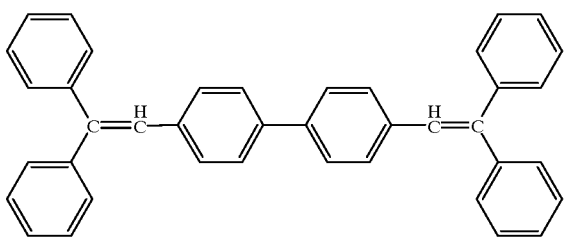

N,N'-diphenylquinacridone, 3-(2'-benzothiazolyl)-7-diethylaminocoumarin (hereinafter referred to simply as coumarin 6), 4-dicyanomethylene-2-methyl-6-(p-dimethylaminostyryl)-4H-pyran (hereinafter referred to simply as DCM), diphenyltetracene, perylene, and the like. These may be used singly or in combination. In addition, fluorescent polymer compounds such as polyparaphenylene vinylene, polyfluorenon or the like may also be used. These materials may also be used for the formation of hole, electron and charge transport materials. Preferably, tris(8-quinolinol)aluminium (Alq) is used.

The emission layer 5 is usually formed in a thickness of 1 to 500 nm.

Thereafter, the cathode 8 is formed on the emission layer 5. The materiel for the cathode 8 should be one that is able to inject electrons into the emission layer and other organic layer in contact with the cathode, if present, and should have good environmental stability. Specific examples include metals such as Al, Mg, In, Sn, Zn, Ag and the like, alloys such as Al and Li alloys, Mg and Ag alloys, Ag and Li alloys and the like. The formation of the cathode 8 is known in the art and is not described herein. The cathode is usually formed in a thickness of 5 to 1000 nm.

The fundamental layer structure including the emission layer 5 alone is described above. In order to ensure more efficient emission, it is preferred to further form the hole injection layer 3, the hole transport layer 4, the electron transport layer 6 and the electron injection layer 7 in a manner as shown in FIG. 1.

If the hole injection layer 3 and/or the hole transport layer 4 are formed by any known techniques after formation of the anode 2. The hole injection and transport layers 3, 4 should preferably have good stability against oxidation and high mobility of holes, be capable of forming a pin-hole free thin film, and be transparent with respect to the fluorescence emitted from the emission layer 5. The hole injection layer 3 may be made of copper phthalocyanine (CuPc), tris [4-(3-methylphenyl)phenylamino)phenyl}amine (M-MTDATA), polyethylenedioxythiophene (PEDOT) and the like. The hole transport layer 4 may be made typically of triphenylamine derivatives. Examples of the triphenylamine derivatives may include 1,1-bis(4-di-p-tolylaminophenyl)cyclohexane, N,N'-diphenyl-N,N'-bis(3-methylphenyl)-1,1'-biphenyl-4,4'-diamine, N,N'-diphenyl-N,N'-bis(p-tolyl)-1, 1'-biphenyl-4,4'-diamine, N,N,N',N'-tetra(p-tolyl)-4,4'-diaminobiphenyl, N,N'-bis(4'-diphenylamino)-4-(biphenylyl)-aniline, N,N'-bis(4'-diphenylamino-4-biphenylyl)-N,N'-diphenylbenzidine, and the like. Of course, other types of materials, which are ordinarily used for this purpose, may also be used including phthalocyanine derivatives, hydrazone derivatives, stilbene derivatives, and the like.

These layers are usually formed in a thickness of 5 to 1000 nm.

As a matter of course, the hole injection and transport layers may be formed as one layer capable of injection and transportation of holes. For this purpose, it is preferred to use a material having such capability as mentioned above, e.g. N,N'-bis [4'-(N,N'-diphenylamino)-4-biphenyryl]-N,N'-diphenylbenzidine (TPT).

Further, after the formation of the emission layer 5, the electron transport layer 6 and/or the electron injection layer 7 is preferably formed on the emission layer 5. If present, the electron transport layer 6 and the electron injection layer 7 are, respectively, made of a material having great mobility of electrons and capable of a pinhole-free thin film. Such materials include, for example, quinolinol metal complexes such as tris(8-quinolinol)aluminium (Alq), bis(10-benzo[h]quinolinol)beryllium and the like, oxadiazole complexes such as 2(4-biphenylyl)5-(4-tert-butylphenyl)-1,3,4-oxadiazole and the like. These layers may be formed as one electron injection and transport layer. For this purpose, Alq is preferably used. If Alq is used, the resultant layer may serve as an emission and electron injection-transport layer.

The electron injection layer and the electron transport layer may be, respectively, formed in a thickness of 5 to 1000 nm.

The second embodiment of the invention is now described. In this embodiment, the organic electroluminescent device comprises, as set forth hereinbefore, a pair of electrodes, and a layer structure provided between the paired electrodes and including an emission layer, a hole injection layer and a hole transport layer wherein at least one of the hole injection layer and the hole transport layer comprises an oligomer selected from the group consisting of a triphenylamine oligomer of the following formula, a thiophene oligomer as defined above, and mixtures thereof

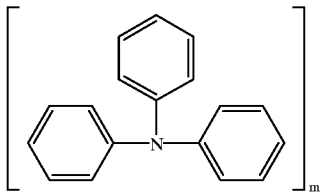

wherein m is an integer of 2 to 6. The triphenylamine oligomer may be substituted or unsubstituted and if present, a substituent such as a lower alkyl group having from 1 to 4 or phenyl is attached to. The three phenyl groups have similar reactivity and may have a substituent at any of the phenyl groups.

Fundamentally, the electrodes and the layer structure as set out with regard to the first embodiment are, respectively, used in this embodiment provided that the emission layer may not contain the thiophene oligomer in this embodiment and that the hole injection and/or transport layer contains such an oligomer as defined above.

The thiophene or triphenylamine oligomer exhibits high hole transportability and can improve luminescent characteristics of the resultant device.

In this case, it is preferred that the oligomer is added to the hole injection and/or transport layer in an amount of 10 to 90 mole % in the layer, respectively.

As a matter of course, such electron injection layer and electron transport layer as set out in the first embodiment may be provided in the device of the second embodiment.

The third embodiment of the invention is next described. The device of this embodiment should fundamentally comprise a pair of electrodes and a layer structure provided between the paired electrodes and including an emission layer, and at least one organic layer in contact with the emission layer wherein the organic layer comprises a fluorescent material having an absorption peak wavelength shorter than a peak wavelength of luminescence emitted from the emission layer. The organic layer may consist of the hole transport layer 4, the electron transport layer 6 or both. The fluorescent material used for this purpose includes those materials mentioned before for use as a charge transport material, e.g. coumarin derivatives, merocyanine derivatives, oxazole derivatives, thiazole derivatives, styryl derivatives, flavone derivatives, quinoline derivatives, condensed polycyclic compounds and the like. These materials should be properly selected depending on the type of luminescent material used in the emission layer so that an absorption peak wavelength becomes shorter than a peak wavelength of luminescence emitted from the emission layer. For instance, when Alq is used as a luminescent material, materials such as a coumarin derivative (e.g. comarin 515) can be conveniently used.

The incorporation of such a fluorescent material enables the device to be significantly improved in durability. The amount of the fluorescent material in the organic layer usually ranges from 0.2 to 5 mole % in the layer.

Figure 2:
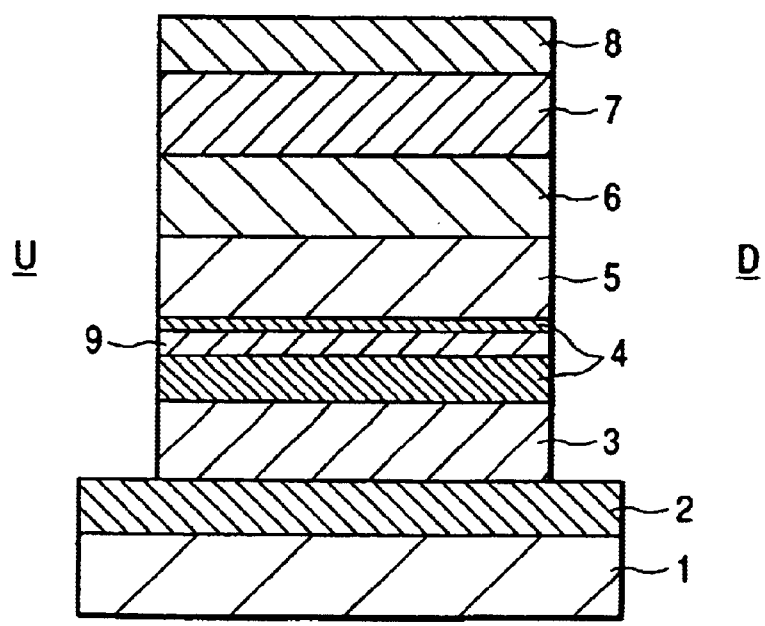
FIG. 2 is a schematic sectional view showing an organic electroluminescent device according to another embodiment of the invention.

The fluorescent material mixed with a hole or electron transport material may be provided in the organic layer of the device of the third embodiment as a sub-layer. This sub-layer is depicted as 9 in FIG. 2. More particularly, the sub-layer 9 is provided in the hole transport layer 4 in the figure. Alternatively, the sub-layer 9 may be provided in the electron transport layer 6 in a thickness of 1 to 50 nm. Preferably, the sub-layer in the organic layer is kept away at a distance of 1 to 900 nm from the emission layer.

The content of the fluorescent material in the mixture is preferably in the range of 0.2 to 5 mole %.

The fourth embodiment of the invention is now described. The device of this embodiment comprises a pair of electrodes, and a layer structure sandwiched between the paired electrodes and including an organic layer capable of transporting electrons or holes and an emission layer wherein the organic layer has a charge transport interference sub-layer therein when the organic layer consists of a hole transport layer made of a hole transport material so that the sub-layer is made of an organic material having an ionization potential greater than the hole transport material of the organic layer, or wherein the organic layer has a charge transport interference sub-layer therein when the organic layer consists of an electron transport layer made of an electron transport material so that the sub-layer is made of an organic material having an electron affinity smaller than an electron transport material of the organic layer.

Figure 3:
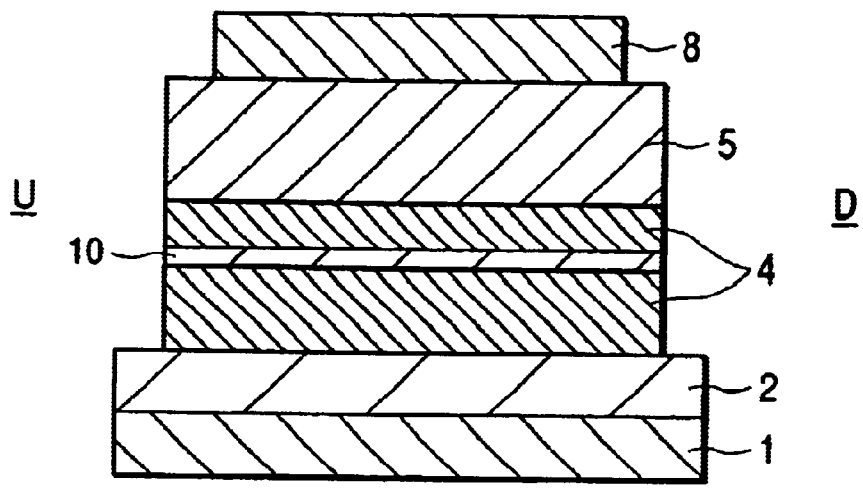
FIG. 3 is a schematic sectional view showing an organic electroluminescent device according to a further embodiment of the invention.

When such a charge transport interference sub-layer as mentioned above is incorporated into the hole transport layer, the transportability of holes can be appropriately controlled. This eventually leads to well-balanced injection of electrons and holes into the emission layer, enabling one to significantly improve emission stability. This arrangement is particularly shown in FIG. 3. FIG. 3 shows an organic electroluminescent device D including a substrate 1, a transparent electrode 2, an electroluminescent unit U having a hole transport layer 4 and an emission layer 5, and a transparent electrode 8 arranged in this order. Of course, this order may be reversed except for the substrate 1. In this arrangement, a charge transport interference sub-layer 10 is formed in the hole transport layer 4 as shown.

The substrate, the pair of electrodes, the hole transport layer and the emission layer may be, respectively, made of such materials as set out and arranged in a similar way as in the foregoing embodiments. The charge transport interference sub-layer 10 may be formed in a similar way as the other organic layers after formation of part of the hole transport layer and is usually formed in a thickness of 5 nm or below, preferably 1 nm or below. Thereafter, the remaining portion of the hole transport layer is formed, followed by further formation of the emission layer as shown in FIG. 3.

The materials for the charge transport interference sub-layer 10 should be one, which is very liable to be sputtered by a vacuum deposition technique and include, for example, 4-dicyanomethylene-2-methyl-6-(p-aminostyryl)-4H-pyran (hereinafter referred to simply as DCM), quinacridones, coumarins, Alq and the like. These materials, respectively, have an ionization potential of 5.5 to 5.9 eV. For the formation of the hole transport layer, a material having an ionization potential smaller than that of a selected material for the sub-layer 10. Although all the hole transport materials mentioned in the foregoing embodiment may be used in proper combination with the interference material, those materials having an ionization potential of 5.4 eV or below are used including aromatic amine compounds such as N,N'-bis [4'-(N,N'-diphenylamino)-4-biphenylyl]N,N'-diphenylbenzidine (hereinafter referred to simply as TPT and having an ionization potential of 5.4 eV), and the like. Preferred combinations include TPT in combination with DCM, coumarins and Alq.

It will be noted that an ionization potential can be determined by an ordinary technique using a UV photoelectron analyzer.

If an organic material used for the interference sub-layer exhibits a small degree of hole transportability or does not have not good film-forming property, the thickness of the sub-layer is made smaller in order to obtain good emission characteristics. This is the reason why the thickness of the sub-layer is defined above in the range of 5 nm or below.

Further, the interference sub-layer 10 may be formed inside the electron transport layer. This is particularly shown in FIG. 4 wherein the sub-layer 10 is provided inside the electron transport layer 6. In this case, a material for the sub-layer should have an electron affinity smaller than that of the material for the electron transport layer 6. Examples of the material useful as the sub-layer include TPT having an electron affinity of 2.4 eV, M-MTDATA having an electron affinity of 1.9 eV, N,N'-di(naphthalene-1-yl)-N,N'-diphenylbenzidne (NPB) having an electron affinity of 2.4 eV, and the like.

In this case, the sub-layer is formed in such a thickness as defined with respect to the above embodiment.

When this type of interference sub-layer is formed in the layer structure, transport of electrons in the electron transport layer can be appropriately controlled. This contributes to well-balanced injection of electrons and holes into the emission layer, thereby improving emission stability and a luminous efficiency. The electron affinity can be determined by subtracting the value of an energy gap from the value of an ionization potential. The ionization potential is measured by means of a UV photoelectron, the energy gap can be measured by an ordinary technique using a spectrophotometer.

next, the fifth embodiment of the invention is described. According to this embodiment, there is provided an organic electroluminescent device comprising a pair of electrodes, and a layer structure sandwiched between the paired electrodes and including a charge transport layer and an emission layer wherein the charge transport layer has a charge transport interference sub-layer therein, and the sub-layer is made of a mixture of both a hole transport material and electron transport material, an inorganic compound or a metal.

Figure 4:
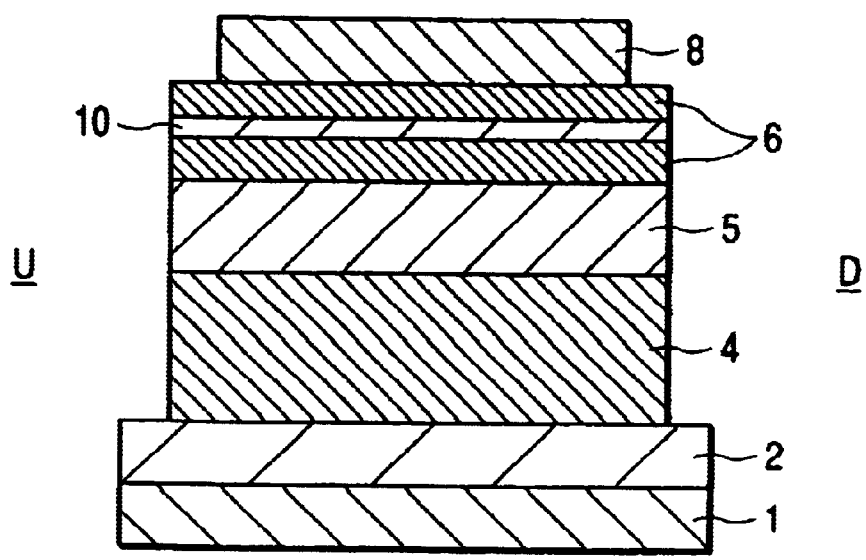
FIG. 4 is a schematic sectional view showing an organic electroluminescent device according to a further embodiment of the invention.

In the case, the charge transport layer may be provided between the anode and the emission layer or between the cathode and the emission layer. The charge transport layer may be made of a material capable of transporting electrons and holes and including TPT, Alq and the like. In this embodiment, the charge transport interference sub-layer is provided inside the charge transport layer in a manner as shown in FIG. 3 or 4. This sub-layer may be made of a mixture of both a hole transport material and an electron transport material. Examples of these materials are those mentioned with regard particularly to the first embodiment. Preferably, hole transport materials include aromatic amine compounds indicated in the foregoing embodiments, and the electron transport materials include metal complex compounds such as Alq. The mixing ratio by mole of the hole transport material and the electron transport material is not critical and is generally in the range of 1:99 to 99:1. The thickness and other arrangement may be the same as in the third and fourth embodiments of the invention.

The provision of the sub-layer made of the mixture can significantly improve emission stability because of the well-balanced action of the mixture on the injection of electrons and holes into the emission layer.

Similar effects can be obtained when using an inorganic compound in place of the mixture of the electron and hole transport materials. Examples of the inorganic compounds include oxides, halides, nitrides, sulfides, hydroxides and the like. Specific examples include SiO, $SiO_2$, GeO, $GeO_2$, LiF, $Li_2O$, MgF, CaF and the like. The layer thickness is in the range of 5 nm or below, preferably, 1 nm or below as in the foregoing embodiments.

Moreover, the mixture may be replaced by a metal such as Al, Ag, In, Au, Pd or the like. When the charge transport layer consists of a hole transport layer, the metal used for this purpose should preferably have a work function whose value is larger than an ionization potential of a hole transport material used for the hole transport layer. Such a metal includes Au, Pt or the like.

In the fourth and fifth embodiments, the charge transport interference sub-layer provided inside the hole transport layer, electron transport layer or charge transport layer should preferably be provided without contact with an electrode or the emission layer as depicted in FIGS. 3 and 4. If the interference sub-layer is provided in contact with an electrode or the emission layer, there is the possibility that an injection characteristic of charges and an emission characteristic may lower. Thus, a device of a high efficiency may not be expected.

It will be noted that in all the embodiments, one material may be used to form the emission layer serving also as the hole transport layer, electron transport layer or charge transport layer. For instance, Alq may be used both as the emission layer and the electron transport layer or charge transport layer.

The invention is more particularly described by way of examples.

EXAMPLE 1

A glass substrate was provided wherein a transparent anode made of an indium-tin oxide (ITO) film had been previously formed and subjected to patterning in the form of an electrode. After sufficient washing of the substrate, the substrate was set in a vacuum chamber along with materials to be vacuum deposited, followed by exhaustion to $10^{-4}$ Pa. Thereafter, N,N'-bis [4'-(N,N-diphenylamino)-4-biphenyryl]-N,N'-diphenyl benzidine (TPT) was deposited in a thickness of 50 nm for use as a hole injection and transport layer. Subsequently, a mixed film of Alq and a thiophene derivative of the following formula (1) was formed as an emission layer in a thickness of 25 nm.

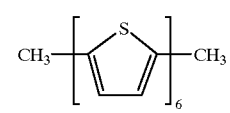

(1)

For the film formation, there was used a co-deposition technique wherein two materials were, respectively, evaporated from separate vacuum evaporation sources, and the mixing ratio of the compound of the formula (1) to Alq was at 1 mol %. Further, Alq was deposited in a thickness of 25 nm to form an electron injection and transport layer, followed by forming a 150 nm thick AlLi alloy film as a cathode, thereby obtaining an electroluminescent device. These film formations were continuously conducted without breaking a vacuum. The film thicknesses were monitored by means of a crystal-controlled oscillator. Immediately after fabrication of the device, the electrodes were led out in dry nitrogen. Subsequently, device characteristics were measured. When a voltage of 5V was applied to the device, uniform yellow light could be emitted. A current of 100 $mA/cm^2$ was applied to the device to measure a drive voltage and an emission luminance, with the result that the voltage was at 5.5 V and the luminance was at 3850 cd/cm².

When this device was continuously driven (at a constant current) in dry nitrogen at an initial luminance of 1000 cd/m², a time (i.e. a half life of luminance) before the luminance arrived at 500 cd/m² that is the half of the initial luminance was 850 hours. The increment in voltage after driving over 500 hours was found to be 0.8 V.

EXAMPLE 2

The general procedure of Example 1 was repeated except that a mixed film of Alq and a thiophene derivative of the following formula (2) was provided as the emission layer, thereby obtaining a device

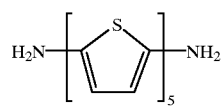
(2)

The mixing ratio of the thiophene derivative of the formula (2) to Alq was at 1 mol %. When a voltage of 5V was applied to the resultant device, uniform orange light emission was obtained. A current of 100 mA/cm² was applied to the device to measure a drive voltage and an emission luminance, with the result that the voltage was at 5.4 V and the luminance was at 4200 cd/cm².

When this device was continuously driven (at a constant current) in dry nitrogen at an initial luminance of 1000 cd/m², the luminance half life was 850 hours. The increment in voltage after driving over 500 hours was found to be 0.6 V.

EXAMPLE 3

A glass substrate was provided wherein a transparent anode made of an indium-tin oxide (ITO) film had been previously formed and subjected to patterning in the form of an electrode. After sufficient washing of the substrate, the substrate was set in a vacuum chamber along with materials to be vacuum deposited, followed by exhaustion to $10^{-4}$ Pa. Thereafter, a mixed film of a thiophene derivative of the afore-indicated formula (1) and TPT was formed in a thickness of 25 nm as a hole injection layer. The mixed film was formed by evaporating the two materials from separate evaporation sources at a mixing ratio by mole of 1:1. Thereafter, TPT was formed as a 25 nm thick hole transport layer. Subsequently, an Alq film was formed as an emission layer serving also as an electron injection and transport layer in a thickness of 50 nm.

Next, an AlLi alloy was formed as a 150 nm thick film for use as a cathode, thereby obtaining a device. These film formations were continuously conducted without breaking a vacuum. The film thicknesses were monitored by means of a crystal-controlled quartz oscillator. Immediately after fabrication of the device, the electrodes were led out in dry nitrogen. Subsequently, device characteristics were measured. When a voltage of 5V was applied to the device, uniform yellowish greenlight could be emitted. A current of 100 mA/cm² was applied to the device to measure a drive voltage and an emission luminance, with the result that the voltage was at 5.1 V and the luminance was at 2350 cd/cm².

When this device was continuously driven (at a constant current) in dry nitrogen at an initial luminance of 1000 cd/m², a luminance half life was 500 hours. The increment in voltage after driving over 500 hours was found to be 0.5 V.

EXAMPLE 4

The general procedure of Example 3 was repeated except that a mixed film of a thiophene derivative of the formula (1) and a thiophene derivative of the following formula (3) was used as a hoe injection layer, thereby obtaining a device

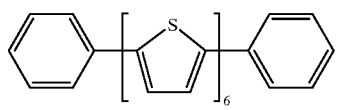
(3)

When a voltage of 5V was applied to the resultant device, uniform yellowish greenlight emission was obtained. A current of 100 mA/cm² was applied to the device to measure a drive voltage and an emission luminance, with the result that the voltage was at 5.8 V and the luminance was at 2440 cd/cm².

When this device was continuously driven (at a constant current) in dry nitrogen at an initial luminance of 1000 cd/m², the luminance half life was 620 hours. The increment in voltage after driving over 500 hours was found to be 0.7 V.

EXAMPLE 5

A glass substrate was provided wherein a transparent anode made of an indium-tin oxide (ITO) film had been previously formed and subjected to patterning in the form of an electrode. After sufficient washing of the substrate, the substrate was set in a vacuum chamber along with materials to be vacuum deposited, followed by exhaustion to $10^{-4}$ Pa. Thereafter, a TPT film was formed in a thickness of 25 nm as a hole injection layer. Thereafter, a mixed film of TPT and perylene (having an absorption peak wavelength of 438 nm) was formed as a hole transport layer in a thickness of 25 nm. The mixed film was formed by a co-deposition technique wherein the two materials were evaporated from separate evaporation sources at a mixing ratio of perylene to TPT of 1 mole %. Subsequently, an Alq film (having a fluorescent peak wavelength of 525 nm) was formed as an emission layer serving also as an electron injection and transport layer in a thickness of 50 nm. Next, an AlLi alloy was formed as a 150 nm thick film for use as a cathode, thereby obtaining a device. When a voltage of 5V was applied to the device, uniform yellowish green light could be emitted. EL spectra were measured, revealing that no emission from perylene was observed. A current of 100 mA/cm² was applied to the device to measure a drive voltage and an emission luminance, with the result that the voltage was at 5.9 V and the luminance was at 2300 cd/cm². When this device was continuously driven (at a constant current) in dry nitrogen at an initial luminance of 1000 cd/m², a luminance half life was 610 hours. The increment in voltage after driving over 500 hours was found to be 1.5 V.

EXAMPLE 6

The general procedure of Example 5 was repeated except that 9,10-diphenylanthracene (having an absorption peak wavelength of 277 nm) was used in place of perylene, thereby obtaining a device. When a voltage of 5V was applied to the resultant device, uniform yellowish greenlight emission was obtained. Emission spectra were measured, revealing that no emission from 9,10-diphenylanthracene was observed. A current of 100 mA/cm² was applied to the device to measure a drive voltage and an emission luminance, with the result that the voltage was at 6.1 V and the luminance was at 2210 cd/cm$^2$. When this device was continuously driven (at a constant current) in dry nitrogen at an initial luminance of 1000 cd/m$^2$, the luminance half life was 420 hours. The increment in voltage after driving over 500 hours was found to be 1.7 V.

EXAMPLE 7

The general procedure of Example 5 was repeated except that coumarin 515 (made by Exciton Co., Ltd., and having an absorption peak wavelength of 419 nm) was used in place of perylene, thereby obtaining a device When a voltage of 5V was applied to the resultant device, uniform yellowish greenlight emission was obtained. Emission spectra were measured, revealing that no emission from coumarin 515 was observed. A current of 100 mA/cm$^2$ was applied to the device to measure a drive voltage and an emission luminance, with the result that the voltage was at 6.3 V and the luminance was at 2380 cd/cm$^2$. When this device was continuously driven (at a constant current) in dry nitrogen at an initial luminance of 1000 cd/m$^2$, the luminance half life was 500 hours. The increment in voltage after driving over 500 hours was found to be 1.2 V.

EXAMPLE 8

A glass substrate was provided wherein a transparent anode made of an indium-tin oxide (ITO) film had been previously formed and subjected to patterning in the form of an electrode. After sufficient washing of the substrate, the substrate was set in a vacuum chamber along with materials to be vacuum deposited, followed by exhaustion to 10$^{-4}$ Pa. Thereafter, a mixed film of TPT and 9,10-diphenylanthracene was formed in a thickness of 25 nm. The mixed film was formed by a co-deposition technique wherein the two materials were evaporated from separate evaporation sources at a mixing ratio of 9,10-diphenylanthracene to TPT of 1 mole %. Thereafter, a TPT film was formed in a thickness of 25 nm. Subsequently, an Alq film was formed in a thickness of 50 nm. Next, an AlLi alloy was formed as a 150 nm thick film for use as a cathode, thereby obtaining a device.

When a voltage of 5V was applied to the device, uniform yellowish green light could be emitted. EL spectra were measured, revealing that no emission from 9,10-diphenylanthracene was observed. A current of 100 mA/cm$^2$ was applied to the device to measure a drive voltage and an emission luminance, with the result that the voltage was at 6.7 V and the luminance was at 2590 cd/cm$^2$. When this device was continuously driven (at a constant current) in dry nitrogen at an initial luminance of 1000 cd/m$^2$, a luminance half life was 380 hours. The increment in voltage after driving over 500 hours was found to be 1.8 V.

EXAMPLE 9

The general procedure of Example 8 was repeated except that coumarin 515 (made by Exciton Co., Ltd.) was used in place of 9,10-diphenylanthracene, thereby obtaining a device.

When a voltage of 5V was applied to the resultant device, uniform yellowish greenlight emission was obtained. Emission spectra were measured, revealing that no emission from coumarin 515 was observed. A current of 100 mA/cm$^2$ was applied to the device to measure a drive voltage and an emission luminance, with the result that the voltage was at 6.2 V and the luminance was at 2460 cd/cm$^2$. When this device was continuously driven (at a constant current) in dry nitrogen at an initial luminance of 1000 cd/m$^2$, the luminance half life was 500 hours. The increment in voltage after driving over 500 hours was found to be 1.0 V.

EXAMPLE 10

The general procedure of Example 8 was repeated except that DCM (made by Exciton Co., Ltd.) was used in place of 9,10-diphenylanthracene, thereby obtaining a device.

When a voltage of 5V was applied to the resultant device, uniform yellowish greenlight emission was obtained. Emission spectra were measured, revealing that no emission from DCM was observed. A current of 100 mA/cm$^2$ was applied to the device to measure a drive voltage and an emission luminance, with the result that the voltage was at 6.5 V and the luminance was at 2480 cd/cm$^2$. When this device was continuously driven (at a constant current) in dry nitrogen at an initial luminance of 1000 cd/m2, the luminance half life was 300 hours. The increment in voltage after driving over 500 hours was found to be 1.5 V.

EXAMPLE 11

A glass substrate was provided wherein a transparent anode made of an indium-tin oxide (ITO) film had been previously formed and subjected to patterning in the form of an electrode. After sufficient washing of the substrate, the substrate was set in a vacuum chamber along with materials to be vacuum deposited, followed by exhaustion to 10$^{-4}$ Pa. Thereafter, a TPT film was formed in a thickness of 10 nm, after which a mixed film of TPT and 9,10-diphenylanthracene was formed in a thickness of 25 nm. The mixed film was formed by a co-deposition technique wherein the two materials were evaporated from separate evaporation sources at a mixing ratio of 9,10-diphenylanthracene to TPT of 1 mole %. Thereafter, a TPT film was further formed on the mixed film in a thickness of 15 nm. Subsequently, an Alq film serving as an emission layer and also as an electron injection and transport layer was formed in a thickness of 50 nm. Next, an AlLi alloy was formed as a 150 nm thick film for use as a cathode, thereby obtaining a device.

When a voltage of 5V was applied to the device, uniform yellowish green light could be emitted. EL spectra were measured, revealing that no emission from 9,10-diphenylanthracene was observed. A current of 100 mA/cm$^2$ was applied to the device to measure a drive voltage and an emission luminance, with the result that the voltage was at 6.5 V and the luminance was at 2530 cd/cm$^2$. When this device was continuously driven (at a constant current) in dry nitrogen at an initial luminance of 1000 cd/m$^2$, a luminance half life was 370 hours. The increment in voltage after driving over 500 hours was found to be 1.6 V.

EXAMPLE 12

The general procedure of Example 8 was repeated except that coumarin 515 (made by Exciton Co., Ltd.) was used in place of 9,10-diphenylanthracene, thereby obtaining a device.

When a voltage of 5V was applied to the resultant device, uniform yellowish greenlight emission was obtained. Emission spectra were measured, revealing that no emission from DCM was observed. A current of 100 mA/cm$^2$ was applied to the device to measure a drive voltage and an emission luminance, with the result that the voltage was at 6.8 V and the luminance was at 2570 cd/cm$^2$. When this device was continuously driven (at a constant current) in dry nitrogen at an initial luminance of 1000 cd/m$^2$, the luminance half life was 420 hours. The increment in voltage after driving over 500 hours was found to be 1.3 V.

Comparative Example 1

The general procedure of Example 1 was repeated except that Alq serving both as an emission layer and as an electron injection layer, thereby obtaining a device. When a voltage of 5 V was applied to the device, uniform yellowish greenlight emission was obtained. A current of 100 mA/cm$^2$ was applied to the device to measure a drive voltage and an emission luminance, with the result that the voltage was at 6.2 V and the luminance was at 2310 cd/cm$^2$. When this device was continuously driven (at a constant current) at an initial luminance of 1000 cd/m$^2$, the luminance half life was 300 hours. The increment after driving over 500 hours was found to be 2.0 V.

Comparative Example 2

The general procedure of Example 3 was repeated except that a thiophene derivative of the afore-indicated formula (1) was used as a hot injection layer, thereby obtaining a device. When a voltage of 5 V was applied to the device, uniform yellowish green light emission was obtained. A current of 100 mA/cm$^2$ was applied to the device to measure a drive voltage and an emission luminance, with the result that the voltage was at 5.7 V and the luminance was at 2080 cd/cm$^2$. When this device was continuously driven (at a constant current) at an initial luminance of 1000 cd/m$^2$, the short-circuiting between the electrodes took place before the luminance was reduced to half, and thus, the device did not work.

In view of the results of Examples 1 to 12 and Comparative Examples 1, 2, it will be seen that the devices of the invention are superior in luminous efficiency and drive durability to those devices of the comparative examples.

In the following examples, TPT was used as a hole transport material, Alq was used as an electron transporting emission material, and a device arrangement was such that an anode, a hole transport layer, an emission layer and a cathode were superposed on a substrate in this order. As a matter of course, the order of the superposition on the substrate may be reversed.

EXAMPLE 13

In this example, an organic electroluminescent device has such an arrangement including a glass substrate, on which a transparent electrode made of ITO has been preliminarily formed in a desired pattern, and a hole transport layer, an emission layer and a cathode are successively vacuum deposited on the glass substrate as shown in FIG. 3. A charge transport interference layer provided inside the hole transport layer is made of DCM (4-dicyanomethylene-2-methyl-6-(p-dimethylaminostyryl)-4H-pyran). Fabrication of the device is described below.

A fully washed ITO electrode-bearing glass substrate, TPT, Alq, DCM, aluminium and lithium were, respectively, set in a vacuum deposition apparatus.

The apparatus was evacuated to 2×10$^{-4}$ Pa, after which TPT set in position was vacuum deposited at a rate of 0.1 nm/second to form a 30 nm thick hole transport layer. Thereafter, DCM was vacuum deposited at a rate of 0.02 nm/second to form a 1 nm thick charge transport interference layer. TPT was again vacuum deposited to form a 20 nm thick hole transport layer. Alq serving as an electron transporting and luminescent material was vacuum deposited at a rate of 0.1 nm/second to form a 50 nm thick emission layer. Thereafter, aluminium and lithium were subjected to vacuum deposition from separate evaporation sources to form a 150 nm thick co-deposition layer for use as a cathode. These vacuum depositions were continuously conducted without breakage of the vacuum, and the film thickness was monitored by means of a crystal-controlled oscillator.

Immediately after fabrication of the device, electrodes were led out in dry nitrogen, followed by measurement of characteristics. The luminous efficiency of the device was defined at an emission luminance of 100 cd/m$^2$. The drive life was defined as a time before the luminance was reduced to 500 cd/m$^2$ that is the half of the initial luminance when the device was driven or run at a given current.

A similar measurement was performed in the same manner as set out above while using, as a charge transport interference layer, quinacridone of the following formula (a), coumarin of the following formula (b) and Alq

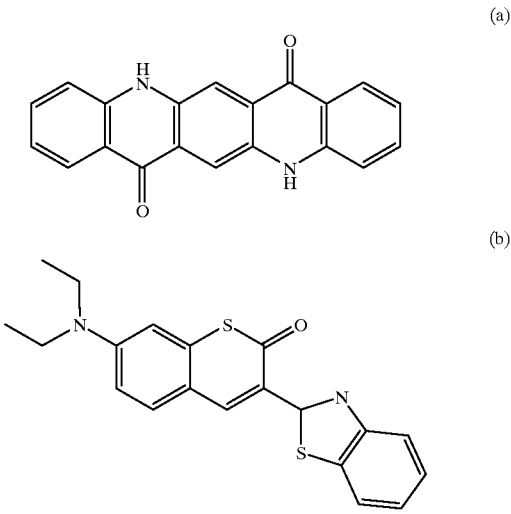

These results are shown in Table 1 below. The ionization potential values of the compounds that are determined by means of a surface anaylzer (AC-1), made by Riken Keiki Co., Ltd., are also shown in the table.

TABLE 1

| Charge transport interference layer | Ionization potential (eV) | Luminous efficiency (lm/W) | Drive life (hours) |
| --- | --- | --- | --- |
| DCM | 5.6 | 3.0 | 1500 |
| Quinacridone | 5.5 | 2.8 | 1400 |
| Coumarin | 5.6 | 2.9 | 1700 |
| Alq | 5.9 | 3.1 | 1900 |
| nil | — | 2.5 | 300 |

It will be noted that the ionization potential of TPT used as a hole transport material is at 5.4 eV.

From the results of Table 1, the organic electroluminescent devices of the invention are excellent in luminous efficiency and drive life.

EXAMPLE 14

The general procedure of Example 13 was repeated except that a mixed layer of TPT serving as a hole transport material and Alq serving as an electron transport material was formed as a charge transport interference layer, thereby obtaining a device. The mixed film was formed by a co-deposition technique using the TPT and Alq at a ratio by mole of 1:1 in a thickness of 5 nm.

The device was subjected to measurements of a luminous efficiency and a drive life in the same manner as in Example 13. As a result, it was found that the luminous efficiency and drive life of the device were, respectively at 2.81 m/W and 1700 hours. Thus, the device was excellent in the characteristic properties.

EXAMPLE 15

The general procedure of Example 13 was repeated using a 1 nm thick germanium oxide film as a charge transport interference layer, thereby obtaining a device. The device was subjected to measurements of a luminous efficiency and a drive life in the same manner as in Example 13.

As a result, it was found that the luminous efficiency and drive life of the device were, respectively, at 2.81 m/W and 1700 hours. Thus, the device was excellent in the characteristic properties.

EXAMPLE 16

The general procedure of Example 13 was repeated using a 1 nm thick silver film as a charge transport interference layer, thereby obtaining a device. The device was subjected to measurements of a luminous efficiency and a drive life in the same manner as in Example 13.

As a result, it was found that the luminous efficiency and drive life of the device were, respectively, at 2.31 m/W and 1200 hours. Thus, the device was excellent in the characteristic properties.

EXAMPLE 17

This example illustrates an organic electroluminescent device of the type shown in FIG. 4 wherein a charge transport interference layer is formed inside an electron transport layer. In this example, TPT was used as a charge transport interference layer, DPVBi of the following formula (c) was as a luminescent material, and Alq was as an electron transport material

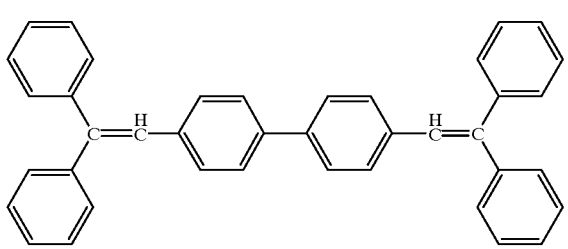

(c)

The device was fabricated in the following manner.

A fully washed ITO electrode-bearing glass substrate, TPT, Alq, DCM, aluminium and lithium were, respectively, set in a vacuum deposition apparatus.

The apparatus was evacuated to $2\times10^{-4}$ Pa, after which TPT set in position was vacuum deposited at a rate of 0.1 nm/second to form a 50 nm thick hole transport layer. Thereafter, DPVBi serving as a luminescent material was vacuum deposited at a rate of 0.1 nm/second to form a 25 nm thick emission layer. Alq serving as an electron transport material was vacuum deposited at a rate of 0.1 nm/second to form a 12.5 nm thick electron transport layer. Thereafter, TPT serving as a charge transport interference layer was vacuum deposited at a rate of 0.02 nm in a thickness of 1 nm. Moreover, Alq was again vacuum deposited at a rate of 0.1 nm/second to form a 12.5 nm thick electron transport layer. Thereafter, aluminium and lithium were subjected to vacuum deposition from separate evaporation sources to form a 150 nm thick co-deposition layer for use as a cathode. These vacuum depositions were continuously conducted without breakage of the vacuum, and the film thickness was monitored by means of a crystal-controlled oscillator.

Immediately after fabrication of the device, electrodes were led out in dry nitrogen, followed by measurement of characteristics.

The results are shown in Table 2 along with a device using no charge transport interference layer. The electron affinity of TPT, which is obtained by subtracting a value at an absorption end measured by means of a spectrophotometer from the ionization potential determined by means of a surface analyzer (AC-1), made by Riken Kiki Co., Ltd., is also shown in the table.

TABLE 2

| Charge transport interference layer | Electron affinity (eV) | Luminous efficiency (lm/W) | Drive life (hours) |
|---|---|---|---|
| TPT | 2.4 | 2.8 | 1000 |
| nil | — | 2.5 | 300 |

The results of Table 2 reveal that the device of the invention is better in the luminous efficiency and drive life that the comparative device.

In this example, TPT was used as the charge transport interference layer, and similar results were obtained when using a mixed layer of a hole transport layer and an electron transport layer, e.g. TPT and Alq. Likewise, good results are obtained when using oxides, halides, nitrides, sulfides, hydroxides and the like inorganic compounds, used singly or in combination, and metals.

What is claimed is:

1. An organic electroluminescent device, which comprises a pair of electrodes, and a layer structure sandwiched between the paired electrodes and including an organic layer capable of transporting electrons or holes and an emission layer wherein the organic layer has a charge transport interference sub-layer in the inside thereof when the organic layer consists of a hole transport layer made of a hole transport material so that the sub-layer is made of an organic material having an ionization potential greater than the hole transport material of the organic layer, or wherein the organic layer has a charge transport interference sub-layer therein when the organic layer consists of an electron transport layer made of an electron transport material so that the sub-layer is made of an organic material having an electron affinity smaller than the electron transport material of the organic layer.

2. An organic electroluminescent device comprising a pair of electrodes, and a layer structure sandwiched between the paired electrodes and including a charge transport layer and an emission layer wherein the charge transport layer has a charge transport interference sub-layer in the inside thereof, and the sub-layer is made of a mixture of both a hole transport material and an electron transport material, an inorganic compound or a metal.

3. Aft organic electroluminescent device according to claim 2, wherein said sub-layer is made of the mixture.

4. An organic electroluminescent device according to claim 3, wherein said mixture consists of a hole transport material and an electron transport material at a ratio by mole of 1:99 to 99:1.

5. An organic electroluminescent device according to claim 2, wherein said sub-layer is made of an inorganic compound selected from the group consisting of oxides, halides, nitrides, sulfides, hydroxides and mixtures thereof.

6. An organic electroluminescent device according to claim 2, wherein said sub-layer is made of a metal.

* * * * *

UNITED STATES PATENT AND TRADEMARK OFFICE
CERTIFICATE OF CORRECTION

PATENT NO. : 6,730,929 B2
DATED : May 4, 2004
INVENTOR(S) : Masao Fukuyama et al.

It is certified that error appears in the above-identified patent and that said Letters Patent is hereby corrected as shown below:

Column 19,
Line 3, change "Aft" to -- An --

Signed and Sealed this

Fifth Day of April, 2005

JON W. DUDAS
*Director of the United States Patent and Trademark Office*